(12) United States Patent
Abe et al.

(10) Patent No.: US 9,553,227 B2
(45) Date of Patent: Jan. 24, 2017

(54) OPTICAL ELEMENT AND CONCENTRATING PHOTOVOLTAIC DEVICE

(71) Applicant: KURARAY CO., LTD., Kurashiki-shi (JP)

(72) Inventors: Koji Abe, Kamisu (JP); Shinji Hiramatsu, Kamisu (JP); Katsuhiro Fujita, Kamisu (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 14/413,617

(22) PCT Filed: Jul. 9, 2013

(86) PCT No.: PCT/JP2013/068695
§ 371 (c)(1),
(2) Date: Jan. 8, 2015

(87) PCT Pub. No.: WO2014/010571
PCT Pub. Date: Jan. 16, 2014

(65) Prior Publication Data
US 2015/0179856 A1 Jun. 25, 2015

(30) Foreign Application Priority Data

Jul. 9, 2012 (JP) ................. 2012-153534

(51) Int. Cl.
*H01L 31/0203* (2014.01)
*H01L 31/054* (2014.01)
(Continued)

(52) U.S. Cl.
CPC .......... *H01L 31/0543* (2014.12); *C08L 53/00* (2013.01); *G02B 1/11* (2013.01); *G02B 3/005* (2013.01);
(Continued)

(58) Field of Classification Search
CPC ............... H01L 31/048; H01L 31/0543; H01L 31/0232; H01L 31/0481; B32B 27/302; B32B 27/325; B32B 27/308; B32B 27/08; B32B 27/304; B32B 27/365; B32B 27/18; G02B 19/042; G02B 19/0014; C08L 5/18; C08L 53/00; C08L 53/02; C08L 53/10; C08L 33/10; C08J 2353/00; C08J 2333/10; C08J 2666/24; C08J 2666/00
(Continued)

(56) References Cited

U.S. PATENT DOCUMENTS

2006/0056032 A1 3/2006 Tsukuda
2009/0133737 A1 5/2009 Anzawa et al.
(Continued)

FOREIGN PATENT DOCUMENTS

AU 2009234841 10/2009
CN 102096125 A 6/2011
(Continued)

OTHER PUBLICATIONS

International Search Report issued Aug. 27, 2013 in PCT/JP2013/068695 filed Jul. 9, 2013.
(Continued)

*Primary Examiner* — Jayne Mershon
(74) *Attorney, Agent, or Firm* — Oblon, McClelland, Maier & Neustadt, L.L.P.

(57) ABSTRACT

Provided are an optical element and a concentrating photovoltaic device which are each capable of preventing warpage and deformation of an optical functional pattern formed in a surface thereof due to stress even in an environment with extreme temperature changes. An optical element (4) of a concentrating photovoltaic device (1) concentrating sunlight includes: a glass substrate (5) and a sheet-like molded body (6) which is made of an organic resin and includes a Fresnel
(Continued)

lens pattern (6a) in a surface and has the other surface bonded to the glass substrate (5). The sheet-like molded body (6) has a tensile elastic modulus of 1500 MPa or less, a linear expansion coefficient of $7.0 \times 10^{-5}/°$ C. or less, an average transmittance of 85% or more in a wavelength range from 350 to 1850 nm at a thickness of 400 μm, and a haze value of 1.0% or less.

11 Claims, 4 Drawing Sheets

(51) Int. Cl.
| | |
|---|---|
| G02B 3/08 | (2006.01) |
| G02B 3/00 | (2006.01) |
| G02B 19/00 | (2006.01) |
| G02B 1/11 | (2015.01) |
| G02B 5/22 | (2006.01) |
| C08L 53/00 | (2006.01) |
| G02B 27/00 | (2006.01) |

(52) U.S. Cl.
CPC . *G02B 3/08* (2013.01); *G02B 5/22* (2013.01); *G02B 19/0014* (2013.01); *G02B 19/0042* (2013.01); *G02B 19/0076* (2013.01); *G02B 27/0006* (2013.01); *Y02E 10/52* (2013.01)

(58) Field of Classification Search
USPC ........................................................ 136/246
See application file for complete search history.

(56) References Cited

U.S. PATENT DOCUMENTS

| | | |
|---|---|---|
| 2011/0030765 A1 | 2/2011 | Yang |
| 2011/0186129 A1 | 8/2011 | Gombert |
| 2011/0218303 A1* | 9/2011 | Oshima ............... C08J 5/18 525/94 |
| 2012/0111407 A1* | 5/2012 | Rummens ............ B32B 7/02 136/259 |
| 2012/0132871 A1 | 5/2012 | Toyohara et al. |
| 2013/0306127 A1* | 11/2013 | Ackermann .......... F24J 2/085 136/242 |

FOREIGN PATENT DOCUMENTS

| | | | |
|---|---|---|---|
| CN | 102209753 | A | 10/2011 |
| CN | 202159153 | U | 3/2012 |
| CN | 102460230 | A | 5/2012 |
| CN | 202275168 | U | 6/2012 |
| EP | 2 278 630 | A1 | 1/2011 |
| EP | 2 345 698 | A1 | 7/2011 |
| EP | 2 437 086 | A1 | 4/2012 |
| JP | 10-158349 | A | 6/1998 |
| JP | 2000-233945 | A | 8/2000 |
| JP | 2006-091847 | A | 4/2006 |
| JP | 2006/332535 | * | 12/2006 |
| JP | 2006-332535 | A | 12/2006 |
| JP | 2006-343435 | A | 12/2006 |
| JP | WO 2010/055798 | * | 5/2010 |
| JP | 2010-224377 | A | 10/2010 |
| JP | 2010-248339 | A | 11/2010 |
| JP | 2011-056701 | A | 3/2011 |
| JP | 2012-212696 | A | 11/2012 |
| KR | 10-2011-0074579 | A | 6/2011 |
| KR | 10-2012-0023115 | A | 3/2012 |
| TW | 201026772 | A1 | 7/2010 |
| TW | 201113557 | A1 | 4/2011 |
| WO | 2009/125722 | A1 | 10/2009 |
| WO | 2010/055798 | A1 | 5/2010 |
| WO | 2010/137695 | A1 | 12/2010 |
| WO | 2011/021694 | A1 | 2/2011 |
| WO | WO 2011/056396 | A2 | 5/2011 |
| WO | WO 2011/056396 | A3 | 5/2011 |
| WO | 2011/112842 | | 9/2013 |

OTHER PUBLICATIONS

Extended European Search Report issued Jan. 28, 2016 in Patent Application No. 13816373.8.
Combined Chinese Office Action and Search Report issued Aug. 19, 2015 in Patent Application No. 201380036860.4 (with English translation of categories of cited documents).
Office Action as received in the corresponding Korean Patent Application No. 10-2015-7002990 dated Oct. 5, 2016.
Philip S. Turner., "Thermal-Expansion Stresses in Reinforced Plastics", Research Paper No. RP1745, vol. 37, Oct. 1946, pp. 239-250.
Office Action as received in the corresponding Mexican Patent Application No. Mx/a/2015/000260 dated Sep. 2, 2016.
David C. Miller, et al., "Durability of Fresnel Lenses: A review specific to the concentrating photovoltaic application", Solar Energy Materials & Solar Cells, May 6, 2011, 95, pp. 2037-2068.

* cited by examiner

OPTICAL ELEMENT AND CONCENTRATING PHOTOVOLTAIC DEVICE

TECHNICAL FIELD

The present invention relates to an optical element having an optical functional pattern in a surface and a concentrating photovoltaic device including the same.

BACKGROUND ART

Uses of natural energies have attracted attention in recent years. One of such uses is photovoltaic that converts solar energy into electric power through solar cells. As a photovoltaic device, there is well known a concentrating photovoltaic device having a configuration in which plural solar cell elements are arranged in a same plane, and condenser lenses (optical elements) configured to concentrate sunlight to the respective solar cell elements are arranged in front of the solar cell elements in order to increase the power generation efficiency (photoelectric conversion efficiency) for providing larger electric power (see Patent Literature 1, for example).

The concentrating photovoltaic device has a configuration in which each solar cell element receives sunlight concentrated by a condenser lens. Accordingly, the expensive solar cell elements can be reduced in size, and the photovoltaic device can be reduced in cost as a whole. The concentrating photovoltaic devices are therefore becoming widespread as power supply applications in areas which get many hours of sunshine and are vast enough for the photovoltaic devices to be installed even if the light collecting surface thereof is enlarged.

RELATED ART

Patent Literature

Patent Literature 1: Japanese Patent Laid-open Publication No. 2006-343435

SUMMARY OF THE INVENTION

Technical Problems

In the concentrating photovoltaic device of Patent Literature 1, a transparent glass substrate is bonded to the surface of each sheet-like condenser lens made of PMMA resin in consideration of the environment resistance and the like.

The areas suitable for power generation using photovoltaic devices (the areas which get many hours of sunshine and are vast enough for the photovoltaic devices to be installed even if the light collecting surface thereof is enlarged) are America's southwest (Nevada and the like), Mediterranean area in Europe, and Middle East, for example. In these areas, there are very large differences in temperature between daytime and nighttime and between summer and winter.

In the above-described areas with extreme temperature changes, the temperature changes cause thermal expansion and contraction of the condenser lenses of a concentrating photovoltaic device when the resin material forming the condenser lenses is PMMA resin as described above. In an environment where the temperature changes by about 40 degrees, for example, a 1 $m^2$ condenser lens made of PMMA resin thermally expand and contract in several millimeters. When the condenser lens thermally expand and contract in several millimeters, the edge of the condenser lens is warped due to the inflexibility of the glass substrate bonded thereto, and part of the concentrated light deviates from the light receiving region of the solar cell element, thus reducing the power generation efficiency.

In a configuration where the condenser lens of the concentrating photovoltaic device is made of silicone resin and is bonded to a glass substrate, the linear expansion coefficient of glass ($0.09 \times 10^{-5}/°$ C.) is considerably different from that of silicone resin (25 to $30 \times 10^{-5}/°$ C.). Moreover, the silicone resin has low hardness.

In the aforementioned area with extreme temperature changes, if the resin material forming the condenser lenses of the concentrating photovoltaic device is silicone resin, a Fresnel lens of the condenser lens which is made of silicone resin and has fine roughness may be deformed by stress due to the low hardness of the silicon resin and a considerable difference between linear expansion coefficients of the glass and silicone resin bonded to each other. As described above, when the Fresnel lens of the condenser lens is deformed, part of the concentrated light deviates from the light receiving region of the solar cell element, thus reducing the power generation efficiency.

Accordingly, an object of the present invention is to provide an optical element and a concentrating photovoltaic device which are each capable of preventing warpage and are deformation in the optical functional pattern (Fresnel lens pattern or the like) formed in a surface thereof due to stress.

Solution to Problems

An invention according to claim 1 to achieve the object is an optical element including: a transparent substrate; a sheet-like molded body which is made of an organic resin and includes an optical functional pattern in a surface thereof and has the other surface bonded to the transparent substrate. The sheet-like molded body has a tensile elastic modulus of 1500 MPa or less, a linear expansion coefficient of $7.0 \times 10^{-5}/°$ C. or less, an average transmittance of 85% or more at least in a visible wavelength range at a thickness of 400 μm, and a haze value of 1.0% or less. When the optical element is irradiated by rays of light including ultraviolet rays with an illuminance of 1 $kW/m^2$ for 600 hours using a metal halide lamp, an average transmittance of the optical element is reduced by 2% or less at least in a wavelength range from 350 nm to 600 nm. In the present invention, the linear expansion coefficient is a value measured at 30° C. according to JIS K7197, and the tensile elastic modulus is a value measured according to JIS K7127.

An invention according to claim 2 is characterized in that the transparent substrate is composed of a glass substrate.

An invention according to claim 3 is characterized in that: the sheet-like molded body is made of a thermoplastic polymer composite including an acrylic block copolymer (A) and an acrylic resin (B); in the thermoplastic polymer composite, the acrylic block copolymer (A) is an acrylic block copolymer including in each molecule, at least a structure in which a polymer block (a2) mainly composed of a methacrylic ester unit is bonded to each end of a polymer block (a1) mainly composed of an acrylic ester unit, the acrylic block copolymer (A) having a weight-average molecular weight of 10,000 to 100,000; the acrylic block copolymer (A) includes an acrylic block copolymer (A1) in which the content of the copolymer block (a2) is 40% by mass or more and 80% by mass or less, and an acrylic block copolymer (A2) in which the content of the copolymer block (a2) is 10% by mass or more and less than 40% by mass; the acrylic resin (B) is mainly composed of a methacrylic ester unit; and the mass ratio ((A)/(B)) of the acrylic block copolymer (A) to the acrylic resin(B) is in a range from 97/3 to 10/90.

An invention according to claim 4 is characterized in that the sheet-like molded body includes an ultraviolet absorbing agent.

An invention according to claim 5 is characterized in that the transparent substrate includes an ultraviolet absorbing agent.

An invention according to claim 6 is characterized by further including an ultraviolet absorbing layer formed on a surface of the transparent substrate opposite to a surface of the transparent substrate bonded to the sheet-like molded body.

An invention according to claim 7 is characterized in that a surface of the transparent substrate opposite to a surface thereof bonded to the sheet-like molded body is subjected to antifouling treatment.

An invention according to claim 8 is characterized in that a surface of the transparent substrate opposite to a surface thereof bonded to the sheet-like molded body is subjected to antireflection treatment.

An invention according to claim 9 is characterized in that the peel strength between the sheet-like molded body and the transparent substrate which are bonded to each other is 25 N/25 mm or more. The peel strength described in the present invention is a value measured by the method of measuring 180° peel strength which is defined in JIS K685-2.

An invention according to claim 10 is characterized in that the surface of the sheet-like molded body to be bonded to the transparent substrate is subjected to any one of plasma treatment, excimer treatment, and corona treatment, and then the transparent substrate is bonded to the surface to be bonded.

An invention according to claim 11 is characterized in that the optical functional pattern formed in the sheet-like molded body is a Fresnel lens pattern.

An invention according to claim 12 is a concentrating photovoltaic device including: an optical element concentrating sunlight; and a solar cell element receiving the sunlight concentrated by the optical element for photoelectric conversion. The optical element is an optical element according to claim 11.

Effects of the Invention

With the optical element according to the present invention, the sheet-like molded body made of an organic resin and is bonded to the transparent substrate has a tensile elastic modulus of 1500 MPa or less, a linear expansion coefficient of $7.0 \times 10^{-5}/°$ C. or less, an average transmittance of 85% or more at least in a visible light wavelength range with a thickness of 400 μm, and a haze value of 1.0% or less.

The sheet-like molded body has a high transmittance. As having a tensile modulus as small as 1500 MPa or less, warpage of the sheet-like molded body is very small even in the environment with extreme temperature changes. Moreover, the linear expansion coefficient thereof ($7.0 \times 10^{-5}/°$ C. or less) is smaller than that of silicone resin. Accordingly, it is possible to minimize deformation of the optical functional pattern formed in the surface even in the environment with extreme temperature changes.

With the optical element according to the present invention, furthermore, the thickness of the transparent substrate to the area thereof is a thickness of 5 mm or less per 1 $m^2$, and the sheet-like molded body preferably has one fifteenth or more of the thickness of the transparent substrate. The average transmittance at least in a wavelength range from 350 to 600 nm is reduced by 2% or less when the sheet-like molded body is irradiated by rays of light including ultraviolet rays with an ultraviolet irradiance of 1 $kW/m^2$ in a wavelength range from 290 to 450 nm for 600 hours using a water-cooling metal halide lamp (M04-L21WBX/SUV) having a rated power of 4 kW.

The sheet-like molded body is therefore capable of maintaining good transmittance over a long period of time.

With the concentrating photovoltaic device according to the present invention, the optical element according to the present invention is provided as the condenser lens, and sunlight is therefore collected well to the light receiving region of the solar cell element over a long period of time. Accordingly, the concentrating photovoltaic device is capable of maintaining the high power generation efficiency.

DESCRIPTION OF EMBODIMENTS

Figure 1:
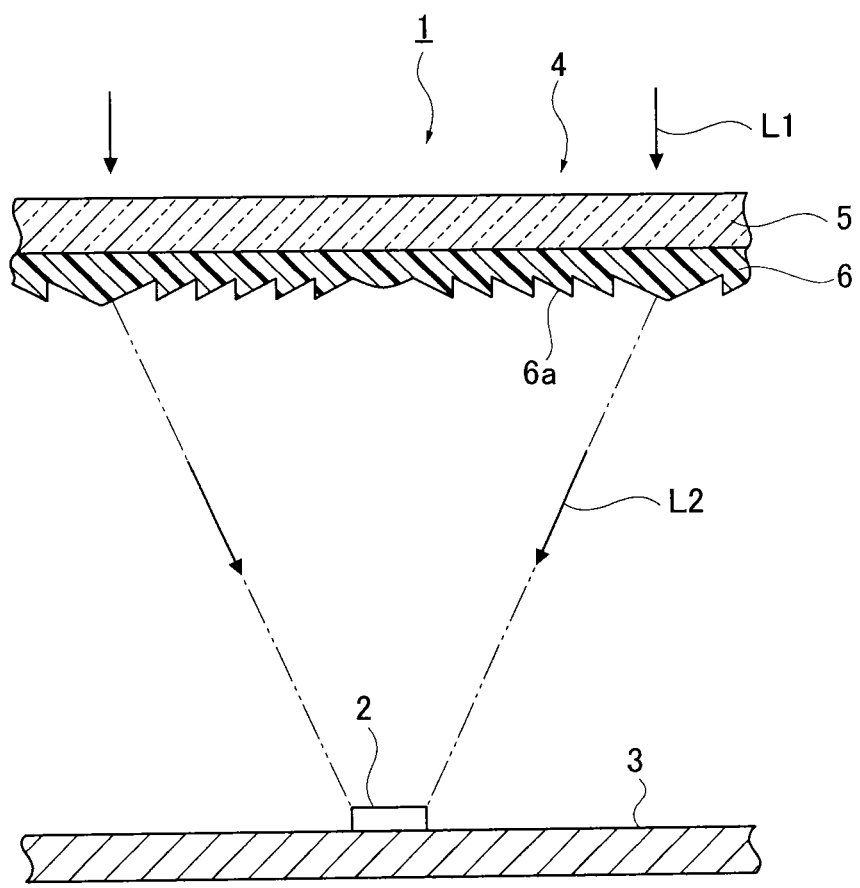
FIG. 1 is a cross-sectional view illustrating a schematic configuration of a concentrating photovoltaic device including an optical element according to the embodiment of the present invention.

Hereinafter, the present invention is described based on an embodiment illustrated in the drawings. FIG. 1 is a schematic cross-sectional view illustrating a schematic configuration of a concentrating photovoltaic device including an optical element according to the embodiment of the present invention.

<Entire Configuration of Concentrating Photovoltaic Device>

As illustrated in FIG. 1, a concentrating photovoltaic device 1 according to the embodiment includes as major constituent members: a solar cell element 2 (a photovoltaic cell) photoelectrically converting received sunlight; a solar cell substrate 3 on which the solar cell element 2 is mounted; and an optical element 4 which is provided in front of (to the sunlight incident side of) the solar cell element 2 so as to face the solar cell element 2 and is configured to concentrate the sunlight. In FIG. 1, L1 indicates sunlight incident on the optical element 4, and L2 indicates sunlight concentrated by the optical element 4.

The optical element 4 includes: a transparent substrate, especially a glass substrate 5 provided to the sunlight incident side; and a sheet-like molded body 6 which is made of a transparent organic resin and is bonded to the surface of the glass substrate 5 on the light emitting side (the surface facing the solar cell element 2) (the sheet-like molded body 6 as a feature of the present invention is described in detail later). In the surface of the sheet-like molded body 6 opposite to the glass substrate 5 (in the surface thereof facing the solar cell element 2), a concentric Fresnel lens pattern 6a is formed. The Fresnel lens pattern 6a concentrates the incident sunlight onto a light receiving region of the solar cell element 2. The sheet-like molded body 6 with the Fresnel lens 6a formed thus functions as a condenser lens.

Figure 2:
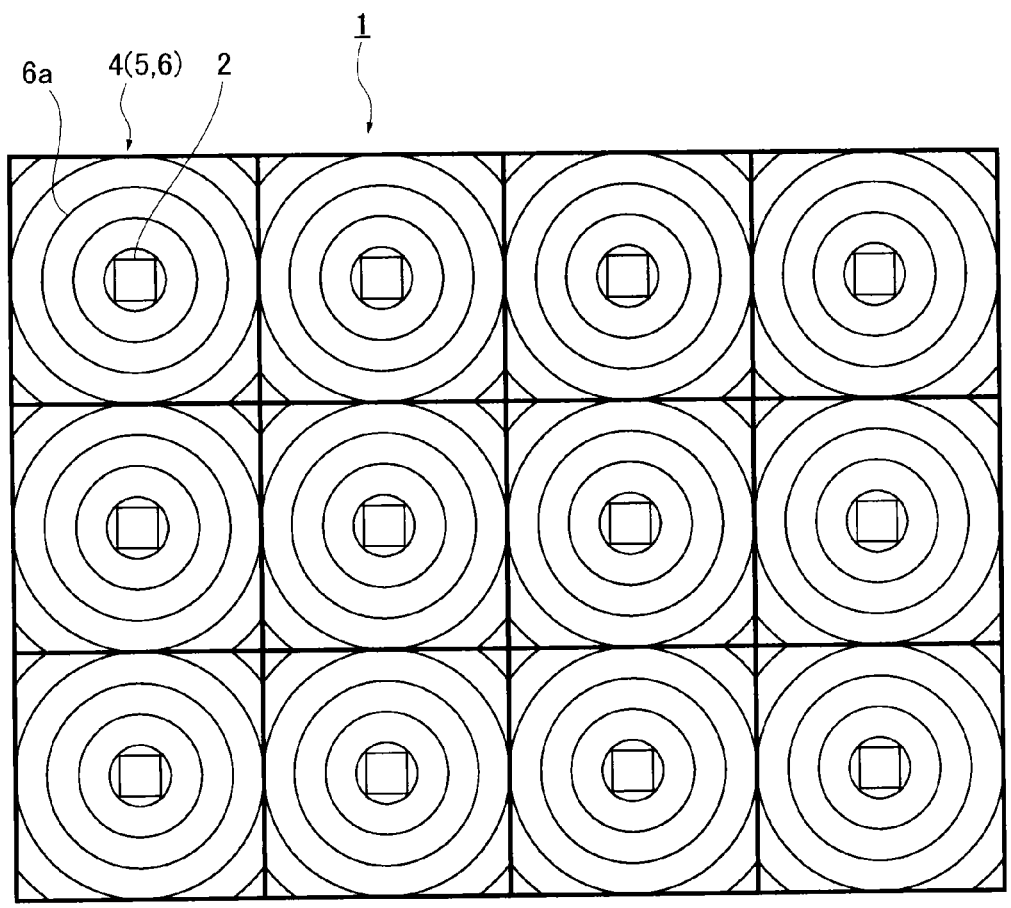
FIG. 2 is a plan view illustrating an outline of the sunlight incident side of the concentrating photovoltaic device according to the embodiment of the present invention.

In the concentrating photovoltaic device 1, as illustrated in FIG. 2, a plurality of the solar cell elements 2 are mounted at regular intervals on the solar cell substrate, and a plurality of the optical elements 4 are integrally provided in a same plane so as to face the respective light receiving regions of the solar cell elements 2.

The glass substrate 5 and sheet-like molded body 6 can be bonded by a well-known method such as thermocompression bonding or an adhesive, and thermocompression bonding is preferable from the viewpoint of thickness precision and the like. In the embodiment, the glass substrate 5 and sheet-like molded body 6 are bonded by thermocompression.

The sheet-like molded body 6 is firmly bonded to the glass substrate 5 so that the peel strength between the sheet-like molded body 6 and the glass substrate 5 boded to each other is preferably 25 N/25 mm or more and more preferably, 50 N/25 mm or more. When the peel strength is 25 N/25 mm or more, the sheet-like molded body 6 can be surely prevented over a long period of time from peeling from the glass substrate 5.

Preferably, before the sheet-like molded body 6 is bonded to the glass substrate 5, the surface of the sheet-like molded body 6 which is to be bonded to the glass substrate 5 is plasma-treated and is then bonded to the glass substrate 5. By modifying the surface of sheet-like molded body 6 which is to be bonded to the glass substrate 5 by the plasma treatment, the adhesion of the sheet-like molded body 6 to the glass substrate 5 is further enhanced. The surface modification can be implemented by not only plasma treatment but also excimer treatment or corona treatment.

The method of producing each optical element 4 having a configuration in which the sheet-like molded body 6 is bonded to the glass substrate 5 is known hot press molding or vacuum lamination molding, for example.

The vacuum lamination molding described in the embodiment of the present invention is a method that: reduces pressure around a mold and a sheet to be molded at a temperature near room temperature to remove air bubbles between the mold and sheet; and then equally applies pressure to the mold and sheet in the vertical direction while heating the same to transfer the shape of the mold to the sheet, thus producing a molded product.

In either the hot press molding or vacuum lamination molding, sheet-like film before molding is brought into close contact with glass by thermocompression, and a shaping mold such as a nickel stamper or the like is then placed on the film and is pressurized to form the sheet-like molded body 6. Alternatively, the sheet-like molded body 6 may be formed by pressurizing and heating the glass substrate, film, and stamper at the same time.

The glass substrate 5 and sheet-like molded body 6 can be bonded to each other by using an adhesive in addition to the aforementioned thermocompression. The adhesive is preferably acrylic resin adhesive containing methyl methacrylate, acrylic monomers, and the like, silicone resin adhesive, or the like, which are excellent in translucence and weather resistance. More preferably, the adhesive is an adhesive composed of the same resin as the sheet-like molded body 6. Moreover, it is preferable that the applied adhesive is as thin as possible.

The solar cell elements 2 and optical elements 4 are positioned with high accuracy, and the peripheral surfaces between the solar cell substrate 3 and optical elements 4 and the like are sealed so as to prevent damp (moisture), dust, and the like from entering the space between the solar cell substrate 3 and optical elements 4. The numbers and sizes of the solar cell elements 2 and optical elements 4 provided facing each other are arbitrary set in accordance with the size and installation place of the concentrating photovoltaic apparatus 1 and the like.

<Details of Sheet-Like Molded Body 6>

The sheet-like molded body 6 of the present invention is made of a thermoplastic polymer composite which is excellent in transparence, weather resistance, flexibility, and the like and includes an acrylic block copolymer (A) and an acrylic resin (B) described below.

In the aforementioned thermoplastic polymer composite, the acrylic block copolymer (A) is an acrylic block polymer including each molecule, at least one structure in which a polymer block (a2) mainly composed of a methacrylic ester unit is bonded to each end of a polymer block (a1) mainly composed of an acrylic ester unit, the acrylic block copolymer (A) having a weight-average molecular weight of 10,000 to 100,000;

the acrylic block copolymer (A) includes an acrylic block copolymer (A1) in which the content of the copolymer block (a2) is 40% by mass or more and 80% by mass or less and an acrylic block copolymer (A2) in which the content of the copolymer block (a2) is 10% by mass or more and less than 40% by mass;

the acrylic resin (B) is mainly composed of a methacrylic ester unit; and the mass ratio of the acrylic block copolymer (A) to the acrylic resin (B) ((A)/(B)) is in a range from 97/3 to 10/90.

The acrylic block copolymer (A) includes in each molecule, at least one structure in which the copolymer block (a2) mainly composed of a methacrylic ester unit is bonded to each end of the copolymer block (a1) mainly composed of an acrylic ester unit, that is, a structure of (a2)-(a1)-(a2) (symbols "-" in this structure indicate chemical bonds).

The acrylic resin (B) is an acrylic resin mainly composed of a methacrylic ester unit. From the viewpoint of increasing the translucency, moldability, and the like of the sheet-like molded body composed of the thermoplastic polymer composite, the acrylic resin (B) is preferably a homopolymer of methacrylic ester or a copolymer mainly composed of a methacrylic ester unit.

The thermoplastic polymer composite in the embodiment is described in detail in WO2010/055798. The sheet-like molded body composed of the thermoplastic polymer composite (a molded body before the Fresnel lens pattern is not formed in the surface) can be manufactured by well-known T-die extrusion or inflation, for example.

Examples of the method of forming the Fresnel lens pattern 6a in the surface of the sheet-like molded body 6 composed of the thermoplastic polymer composite are well-known press molding, injection molding, and photo-polymerization (2P) using ultraviolet curable resin.

The sheet-like molded body 6 made of the above-described thermoplastic polymer composite has physical properties shown below.

To be specific, the sheet-like molded body 6 has: a tensile elastic modulus of 1500 MPa or less, a linear expansion coefficient of $7.0 \times 10^{-5}/°$ C. or less, an average transmittance of 85% or more for a thickness of 400 μm in a wavelength range from 350 to 1850 nm, and a haze value of 1.0% or less. The sheet-like molded body 6 exhibits a pronounced effect when the thickness of the glass substrate 5 to the area is 5 mm or less to an area of 1 m² and the sheet-like molded body 6 has a thickness of one fifteenth or more of the thickness of the glass substrate 5. Moreover, when the sheet-like molded body 6 is exposed to rays of light in the ultraviolet wavelength range with an illuminance of 1 kW/m² for 600 hours using a metal halide lamp, the average transmittance is reduced by 2% or less in the wavelength range from 350 to 600 nm.

The sheet-like molded body 6 of the embodiment is composed of the thermoplastic polymer composite including the aforementioned acrylic block copolymer (A) and acrylic resin (B). Accordingly, the sheet-like molded body 6 has a tensile elastic modulus lower than that of PMMA resin and has a linear expansion coefficient smaller than that of silicone resin.

Even when the optical element 4, in which the sheet-like molded body 6 is bonded to the glass substrate 5, is in the environment with extreme temperature changes, warpage of the sheet-like molded body 6 is small, and the Fresnel lens pattern 6a of the sheet-like molded body 6 deforms very little. Accordingly, even in the environment with extreme temperature changes, light concentrated by the optical element 4 is well received by the light receiving region of the solar cell element 2, and the light transmittance thereof is prevented from being reduced. It is therefore possible to stably maintain the high power generation efficiency over a long period of time.

Figure 3A:
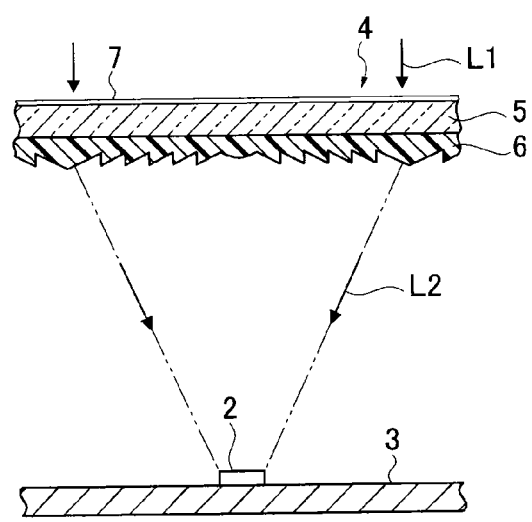
FIG. 3A is a cross-sectional view illustrating a schematic configuration of a concentrating photovoltaic device including an ultraviolet absorbing layer provided on the surface of each optical element.

The sheet-like molded body 6 and/or glass substrate 5 may be configured to include an ultraviolet absorbing agent. As illustrated in FIG. 3A, moreover, the optical element 4 may be provided with an ultraviolet absorbing layer 7 formed by applying an ultraviolet absorbing agent onto the surface of the glass substrate 5 on the sunlight incident side. Ultraviolet rays of sunlight incident on the optical element 4 are absorbed by these configurations, thus preventing the sheet-like molded body 6 from being colored or changed in physical properties because of the ultraviolet rays. It is therefore possible to maintain the high power generation efficiency over a long period of time.

Figure 3B:
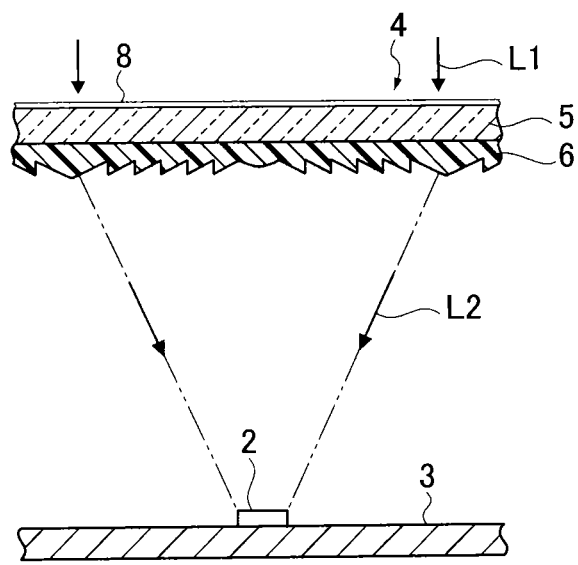
FIG. 3B is a cross-sectional view illustrating a schematic configuration of a concentrating photovoltaic device including an antifouling coating layer provided on the surface of each optical element.

As illustrated in FIG. 3B, the optical element 4 may be provided with an antifouling coating layer 8 formed by applying an antifouling coating agent on the sunlight incident side of the glass substrate 5. The antifouling treatment prevents sand and dust from adhering to the surface of the glass substrate 5 on the sunlight incident side, thus preventing the light transmittance from lowering. It is therefore possible to maintain the high power generation efficiency over a long period of time.

Figure 3C:
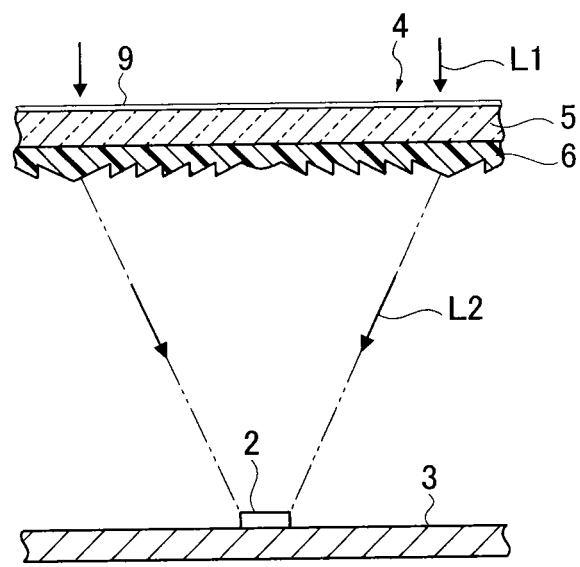
FIG. 3C is a cross-sectional view illustrating a schematic configuration of the concentrating photovoltaic device including an antireflection coating layer provided on the surface of each optical element.

As illustrated in FIG. 3C, the optical element 4 may be provided with an antireflection layer 9 formed by applying an antireflection coating agent on the surface of the glass substrate 5 on the sunlight incident side. Such antireflection treatment increases the sunlight transmittance, thus further increasing the power generation efficiency.

EXAMPLES

Next, the aforementioned effects of the optical element 4 of the present invention are evaluated using optical elements having configurations of Examples 1 to 4 of the present invention and Comparative Examples 1 to 4 for comparison (shown below).

Example 1

In Example 1, a 400 μm thick resin sheet (corresponding to the sheet-like molded body before the Fresnel lens pattern is formed) is plasma-treated for increasing the adhesion and then is pressure-bonded to a 2 mm thick transparent glass substrate at a temperature of 175° C., thus preparing an optical element. The resin sheet is made of a mixture (corresponding to the aforementioned thermoplastic polymer composite) of methacrylic resin and a block copolymer of butyl acrylate (BA) and methyl methacrylate (MMA) and has a linear expansion coefficient of $6.6 \times 10^{-5}/°$ C., a tensile elastic modulus in the MD direction (in the longitudinal direction) of 300 MPa, and a tensile elastic modulus in the TD direction (in the width direction) of 200 MPa.

The block copolymer includes B-1 (MMA/BA=50/50) and B-2 (MMA/BA=30/70). The methacrylic resin is parapet H1000B (by KURARAY CO., LTD.). The thermoplastic resin composite is obtained as a mixture of B-1 in 50% by mass, B-2 in 20% by mass, and methacrylic resin in 30% by mass.

The plasma treatment is carried out as follows: Air plasma is projected using an atmospheric-air plasma apparatus APG-500 (made by KASUGA DENKI Inc.) under the conditions including: a supply air volume of 190 NL/min, a rated output power of 450 to 500 W, and an irradiation distance of 10 mm. The area irradiated by the atmospheric-air plasma is about 3 cm². The plasma is projected onto the entire resin sheet by moving the head under such a condition that the plasma can be projected onto each place for about one second.

Figure 4A:
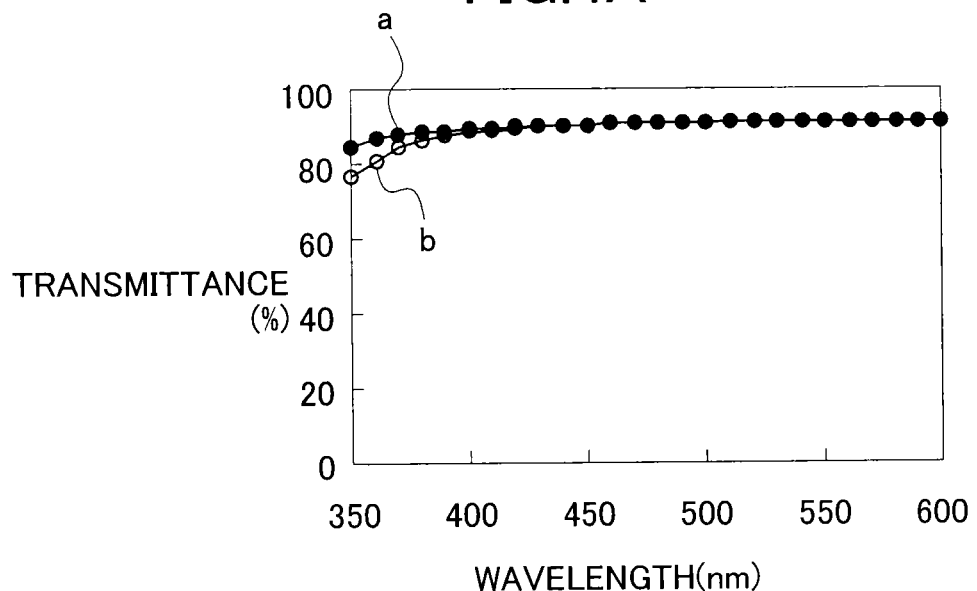
FIG. 4A is a diagram showing measurement results of light transmittance of an optical element of Example 1.

The obtained optical element is used for measurement of a difference in the light transmittance between before and after irradiation of the glass substrate side by a metal halide lamp (with an illuminance of 1 kW/mm² in a wavelength range from 290 to 450 nm (ultraviolet wavelength range)) for 600 hours. FIG. 4A shows measurement results of the light transmittance in Example 1, where a indicates the transmittance characteristic after 600 hour irradiation and b indicates the transmittance characteristic before the irradiation (the irradiation time is 0).

As apparent from the measurement results of FIG. 4A, the optical element of Example 1 described above exhibits good transmittance substantially with no difference between before and after the 600 hour irradiation by the metal halide lamp. The optical element subjected to the 600 hour irradiation has a slightly higher transmittance in the wavelength range from 350 to 400 nm than that of the optical element not irradiated.

Example 2

In Example 2, an optical element prepared in the same conditions as those of Example 1 is cut into a size of 50 cm square and then placed on a flat measurement table for measurement of an amount of warpage of the resin sheet (corresponding to the sheet-like molded body before the Fresnel lens pattern is formed) when the temperature is changed.

In the warpage measurement, the amount of warpage is 0 mm at the edge and center of the resin sheet at room temperature. When the temperature is raised from the room temperature to 65° C. for a predetermined period of time, the amount of warpage is as small as 0.5 mm at the edge of the resin sheet. The amount of warpage at the center of the resin sheet is substantially 0 mm.

Example 3

In Example 3, an optical element having the configuration in which a transparent glass substrate is bonded to a condenser lens with a 20 cm square Fresnel lens pattern formed thereon is prepared using the same resin sheet as that of Example 1 by well-known vacuum lamination molding.

A 10 mm square photosensor is provided at a focal position of the Fresnel lens pattern of the optical element which is fixed, and the amount of light received by the photosensor is measured by projecting a laser beam (wavelength, 532 nm; spot diameter, 5 mmφ)) onto the glass substrate side so that the entire surface of the Fresnel lens pattern surface is scanned. Moreover, in a similar manner, the amount of light received by the photosensor in the absence of the Fresnel lens pattern is measured by projecting a laser beam (wavelength, 532 nm; spot diameter 5 mmφ) with the optical element removed.

Evaluation is made for the amount of light received by the photosensor through the Fresnel lens pattern surface of the prepared optical element and the ratio (lens collecting efficiency) of the amount of light received by the photosensor through the Fresnel lens pattern surface of the prepared optical element to the amount of light received by the photosensor in the absence of the Fresnel lens pattern. As a result, the lens collecting efficiency of the Fresnel lens pattern of the optical element in this example is 90.07%.

Example 4

In Example 4, the lens collecting efficiency is evaluated in a similar manner to Example 3 in a situation where the optical element having the same configuration of that of Example 3 is heated from the room temperature to 50° C. for a predetermined period of time. As a result, the lens collecting efficiency of the Fresnel lens pattern of the optical element in this example is 89.96%. This reveals that the lens collecting efficiency changes very little at 25° C. (room temperature) and 50° C.

Next, expansion of the spot of a laser beam at the focal position is observed at temperatures of 15 and 50° C. In this observation, the laser beam is incident at a position 75 mm apart from the center of the Fresnel lens pattern surface on the glass substrate of the optical element of Example 4. As a result, the spot of the laser beam is expanded very little at the both temperatures of 15 and 50° C.

Comparative Example 1

Figure 4B:
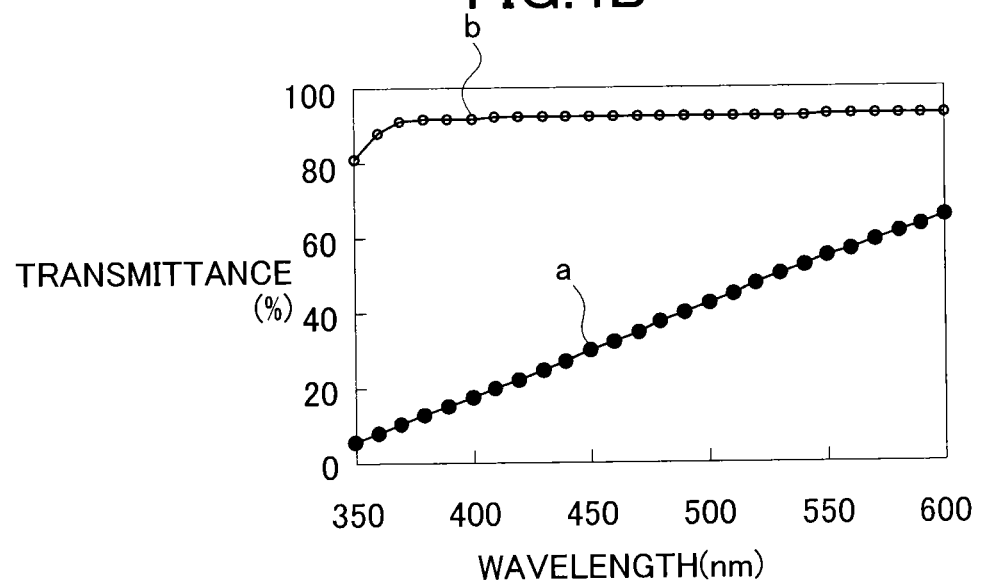
FIG. 4B is a diagram showing measurement results of light transmittance of an optical element of Comparative Example 1.

In Comparative Example 1, a 3 mm thick acrylic resin sheet (parapet GH-SN by KURARAY CO., LTD.) which is commercially-available is used instead of the optical element of Example 1. The difference in light transmittance between before and after 600 hour irradiation with a metal halide lamp (with an illuminance of 1 kW/mm$^2$ in a wavelength range of 290 to 450 nm (ultraviolet wavelength range)) is measured in a similar manner to Example 1. FIG. 4B shows the measurement results of the light transmittance in Comparative Example 1, where a indicates the transmittance characteristic after the 600 hour irradiation and b indicates the transmittance characteristic before start of the irradiation (irradiation time is 0).

As apparent from the measurement results of FIG. 4B, the light transmittance of the 3 mm thick acrylic resin sheet is significantly lowered in a wavelength range from 350 to 600 nm when the 600 hour irradiation is carried out using a metal halide lamp. The light transmittance thereof is notably lowered particularly in the short-wavelength region. In other words, it is revealed that the molded body of the acrylic resin sheet alone is less resistant to light.

Comparative Example 2

In Comparative Example 2, an optical element is prepared in a similar manner to Example 1 other than using a 400 μm PMMA sheet with a tensile elastic modulus of 3300 MPa instead of the resin sheet used in the optical element in Example 1. The prepared optical element is measured in terms of the amount of warpage when the temperature is changed in the same conditions as those of Example 2.

In the aforementioned warpage measurement, the amount of warpage is 0.0 mm at the edge and center of the resin sheet at room temperature. When the temperature is raised from the room temperature to 65° C. for a predetermined period of time, the amount of warpage is 2.1 mm at the edge of the resin sheet. As a result, the amount of warpage of Comparative Example 2 is larger than that of Example 2.

Comparative Example 3

In Comparative Example 3, using a silicone resin sheet instead of the resin sheet of Example 1, an optical element having the configuration in which a transparent glass substrate is bonded to a condenser lens with a 20 cm square Fresnel lens pattern formed thereon is prepared by well-known vacuum lamination molding in a similar manner to Example 3.

In a similar manner to Example 3, a 10 mm square photosensor is provided at a focal position of the Fresnel lens pattern of the prepared optical element which is fixed. The amount of light received by the photosensor is measured by projecting a laser beam (wavelength, 532 nm; spot diameter, 5 mmφ) onto the glass substrate side so that the entire surface of the Fresnel lens pattern surface is scanned. Moreover, in a similar manner, the amount of light received by the photosensor in the absence of the Fresnel lens pattern is measured by projecting a laser beam (wavelength, 532 nm; spot diameter 5 mmφ) with the optical element removed.

Evaluation is made for the amount of light received by the photosensor through the Fresnel lens pattern surface of the optical element and the ratio (lens collecting efficiency) of the amount of light received by the photosensor through the Fresnel lens pattern surface of the optical element to the amount of light received by the photosensor in the absence of the Fresnel lens pattern. As a result, the lens collecting efficiency of the Fresnel lens pattern of the optical element in Comparative Example 3 is 87.9%, which is lower than that in Example 3.

Comparative Example 4

In Comparative Example 4, the lens collecting efficiency is evaluated in a similar manner to Example 3 (Comparative Example 3) in a situation where the optical element having the same configuration as that of Comparative Example 3

(the optical element having the configuration in which the glass substrate is bonded to the silicone resin sheet with the Fresnel lens pattern formed thereon) is heated from the room temperature to 50° C. for a predetermined period of time. As a result, the lens collecting efficiency of the Fresnel lens pattern surface of the optical element in Comparative Example 4 is 80.8%, which is lower than that of Example 4. Compared with Comparative Example 3, the light collecting efficiency of Comparative Example 4 is considerably lower than that when the optical element is not heated.

Next, expansion of the spot of a laser beam at the focal position is observed at temperatures of 15 and 50° C. In this observation, the laser beam is incident at a position 75 mm apart from the center of the Fresnel lens pattern surface on the glass substrate of the optical element of Comparative Example 4. As a result, at a temperature of 15° C., the spot of the laser beam is expanded very little. At a temperature of 50° C., the spot of the laser beam is expanded greatly.

CROSS REFERENCE TO RELATED APPLICATION

This application is based upon and claims the benefit of priority to Japanese Patent Application No. 2012-153534 filed on Jul. 9, 2012, the entire disclosures of which are incorporated herein by reference.

EXPLANATION OF REFERENCE NUMERALS

1 CONCENTRATING PHOTOVOLTAIC DEVICE
2 SOLAR CELL ELEMENT
4 OPTICAL ELEMENT
5 GLASS SUBSTRATE (TRANSPARENT SUBSTRATE)
6 SHEET-LIKE MOLDED BODY
6a FRESNEL LENS PATTERN (OPTICAL FUNCTIONAL PATTERN)

The invention claimed is:
1. An optical element, comprising:
a transparent substrate; and
a sheet-shaped molded body comprising an optical functional pattern in a surface thereof and another surface bonded to the transparent substrate, the optical element is configured to direct light in a predetermined direction by the optical functional pattern,
wherein
the sheet-shaped molded body is made of a thermoplastic polymer composite comprising an acrylic block copolymer (A) and an acrylic resin (B),
wherein the acrylic block copolymer (A) is an acrylic block copolymer comprising in each molecule, at least a structure in which a polymer block (a2) mainly composed of a methacrylic ester unit is bonded to each end of a polymer block (a1) mainly composed of an acrylic ester unit, the acrylic block copolymer (A) having a weight-average molecular weight of 10,000 to 100,000,
the acrylic block copolymer (A) comprises an acrylic block copolymer (A1) comprising the copolymer block (a2) in an amount of 40% by mass to 80%, and an acrylic block copolymer (A2) comprising copolymer block (a2) in an amount of 10% by mass to 40% by mass,
the acrylic resin (B) is mainly composed of a methacrylic ester unit, and
the mass ratio ((A)/(B)) of the acrylic block copolymer (A) to the acrylic resin(B) is in a range from 97/3 to 10/90,
the sheet-shaped molded body has a tensile elastic modulus of 1500 MPa or less, a linear expansion coefficient of $7.0 \times 10^{-5}$/° C. or less, an average transmittance of 85% or more at least in a visible wavelength range at a thickness of 400 μm, and a haze value of 1.0% or less, and
when the optical element is irradiated by rays of light including ultraviolet rays with an illuminance of 1 kW/m$^2$ for 600 hours with a metal halide lamp, an average transmittance of the optical element is reduced by 2% or less at least in a wavelength range from 350 nm to 600 nm,
wherein the transparent substrate has a thickness to an area of the transparent substrate of 5 mm or less to an area of 1 m$^2$ and the sheet-like molded body has a thickness of one fifteenth or more of the thickness of the transparent substrate.

2. The optical element according to claim 1, wherein the transparent substrate is a glass substrate.

3. The optical element according to claim 1, wherein the sheet-shaped molded body further comprises an ultraviolet absorbing agent.

4. The optical element according to claim 1, wherein the transparent substrate further comprises an ultraviolet absorbing agent.

5. The optical element according to claim 1, further comprising an ultraviolet absorbing layer on a surface of the transparent substrate opposite to a surface of the transparent substrate bonded to the sheet-shaped molded body.

6. The optical element according to claim 1, wherein a surface of the transparent substrate opposite to a surface thereof bonded to the sheet-shaped molded body is subjected to antifouling treatment.

7. The optical element according to claim 1, wherein a surface of the transparent substrate opposite to a surface thereof bonded to the sheet-shaped molded body is subjected to antireflection treatment.

8. The optical element according to claim 1, wherein the peel strength between the sheet-shaped molded body and the transparent substrate which are bonded to each other is 25 N/25 mm or more.

9. The optical element according to claim 1, wherein the surface of the sheet-shaped-molded body to be bonded to the transparent substrate is subjected to any one of plasma treatment, excimer treatment, and corona treatment, and then the transparent substrate is bonded to the surface to be bonded.

10. The optical element according to claim 1, wherein the optical functional pattern formed in the sheet-shaped molded body is a Fresnel lens pattern.

11. A concentrating photovoltaic device, comprising:
an optical element concentrating sunlight; and
a solar cell element receiving the sunlight concentrated by the optical element for photoelectric conversion,
wherein
the optical element according to claim 10.

* * * * *